United States Patent [19]

Ohuchi et al.

[11] Patent Number: 4,931,853
[45] Date of Patent: Jun. 5, 1990

[54] IC CARD AND METHOD OF MANUFACTURING THE SAME

[75] Inventors: Masayuki Ohuchi, Tokyo; Hirosi Oodaira, Chigasaki; Kenichi Yoshida, Tokyo, all of Japan

[73] Assignee: Kabushiki Kaisha Toshiba, Kawasaki, Japan

[21] Appl. No.: 403,772

[22] Filed: Sep. 6, 1989

Related U.S. Application Data

[63] Continuation of Ser. No. 32,450, Mar. 31, 1987, abandoned.

[30] Foreign Application Priority Data

May 20, 1986 [JP] Japan ................................ 61-115585

[51] Int. Cl.$^5$ ............................................. H01L 23/02
[52] U.S. Cl. ........................................ 357/74; 357/68; 357/80
[58] Field of Search ......................... 357/80, 74, 67, 68

[56] References Cited

U.S. PATENT DOCUMENTS 4,688,074 8/1987 Iinuma ................................... 357/80
4,731,645 3/1988 Parmienter et al. ................... 357/80

FOREIGN PATENT DOCUMENTS 52-30184 3/1977 Japan ..................................... 357/80
57-7142 1/1982 Japan .
57-07147 1/1982 Japan ..................................... 357/80
58-209133 12/1983 Japan .
61-75488 4/1986 Japan .

OTHER PUBLICATIONS

"IC Mounting Technology", Chp. 5, Section 1; Active Element–Incorporating Technique by Honda.

*Primary Examiner*—Andrew J. James
*Assistant Examiner*—Mark Prenty
*Attorney, Agent, or Firm*—Oblon, Spivak, McClelland, Maier & Neustadt

[57] ABSTRACT

An IC card comprises a thermoplastic resin core sheet and an IC chip bearing a conductive projection formed on an electrode of the IC chip, the IC chip being embedded in the core sheet in such a manner that the exposed top surface of the conductive projection is made flush with the main surface of the core sheet. A conductive layer pattern formed on the main surface of the core sheet is extended for contact with the exposed top surface.

9 Claims, 1 Drawing Sheet

IC CARD AND METHOD OF MANUFACTURING THE SAME

This application is a continuation of application Ser. No. 07/032,450 filed on March 31, 1987, now abandoned.

BACKGROUND OF THE INVENTION

This invention relates to an IC card and the method of manufacturing the same.

In the Japanese Patent application 59-196,206 the present inventors proposed a method of manufacturing an IC card which comprises the steps of embedding a semiconductor IC chip in an insulating core sheet, forming a conductive layer pattern on the main surface of the core sheet, and electrically connecting an electrode deposited on the IC chip to the conductive layer pattern. The proposed IC card-manufacturing method offered the advantage that since the exposed electrode of an IC chip embedded in a core sheet could be directly connected to the conductive layer pattern formed on the main surface of the core sheet, it became possible to provide a thin IC card. In contrast, the conventional IC card-manufacturing method had the drawback in that when the electrode deposited on the IC chip and the conductive layer pattern were connected together by a bonding wire, the so-called loop height (a portion inevitably raised in height due to the bonding wire connection) caused the thickness of the IC card to be increased.

In addition, the previously proposed IC card was further accompanied by the following drawback. Since the surface of the IC chip on which an electrode is formed is made flush with the main surface of the core sheet, part of the conductive layer pattern connected to the electrode contacts part of the surface of the IC chip. The surface of the IC chip is coated with a passivation layer prepared from phosphor silicate glass. Unless, therefore, the passivation layer partly falls off, the above-mentioned contact presents no difficulties. If, however, the passivation layer falls off at the above-mentioned portion, this can cause an electric short circuit between the conductive layer pattern and the IC chip.

Summary of the Invention

This invention has been accomplished in view of the above-mentioned circumstances and is intended to provide an IC card wherein a conductive layer pattern formed on a core sheet is extended through part of the surface of a semiconductor IC chip embedded in the core sheet, and the conductive layer pattern can be connected to the electrode formed on the IC chip without causing an electric short-circuit between the IC chip and the extended end portion of the conductive layer pattern.

An IC card according to this invention comprises an insulating core sheet, a semiconductor IC chip provided with an electrode and embedded in the core sheet, and a conductive layer pattern deposited on the core sheet for being connected to the electrode, wherein the semiconductor IC chip is provided with a conductive projection formed on the electrode and is embedded in the core sheet in such a manner that the exposed top surface of the conductive projection is made flush with the main surface of the core sheet on which the conductive layer pattern is deposited, and the conductive layer pattern is connected with the conductive projection at the exposed top surface.

A method for manufacturing an IC card involving a thermoplastic resin core sheet and a semiconductor IC chip embedded in the core sheet according to this invention comprises the steps of: preparing the thermoplastic resin core sheet with a greater thickness than that of the semiconductor IC chip and forming at least one hole penetrating the core sheet; forming a conductive projection on an electrode deposited on the semiconductor IC chip; inserting the semiconductor IC chip into the penetrating hole with the conductive projection positioned at the side of the main surface of the core sheet; plastically deforming the core sheet involving the inserted semiconductor IC chip by applying heat and pressure between the main and opposite surfaces until the exposed top surface of the conductive projection is made flush with the main surface of the core sheet; and depositing a conductive layer pattern on the main surface so as to be contacted with the exposed top surface.

Detailed Description of the Preferred Embodiments

Figure 1:
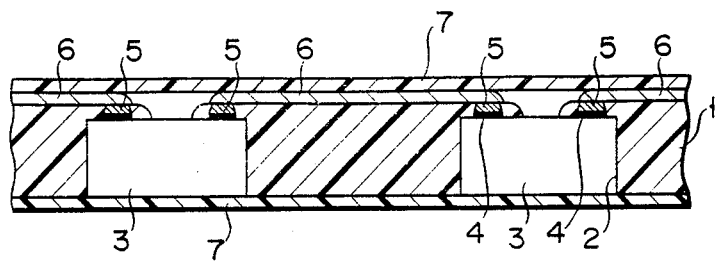
FIG. 1 is a sectional view showing the main parts of an IC card embodying the present invention.

Referring to FIG. 1, core sheet 1 of thermoplastic resin is formed of polycarbonate resin (manufactured by Teijin under the trademark "panlite") having a thickness of, for example, 0.32 mm. In the example of FIG. 1 core sheet 1 has two openings 2. Semiconductor IC chip 3, thinner than core sheet 1 (having a thickness of, for example, 0.29 mm), is embedded in each opening 2, as illustrated in FIG. 1. IC chip 3 comprises a plurality of input or output electrodes 4. Conductive projection 5 is formed on each electrode 4. Conductive projection 5 is made flush with the main surface of core sheet 1. A conductive layer pattern 6 is formed on the main surface of core sheet 1. Conductive layer pattern 6 extends through part of the surface of IC chip 3, and is electrically connected with the top surface of conductive projection 5. The side surface of the conductive projection 5 is surrounded by the same material as that of core sheet 1. The upper surface of core sheet 1, including conductive pattern 6, and the lower surface of core sheet 1 are coated with insulating cover sheet 7. Cover sheet 7 is provided with a plurality of holes (not shown). Data is taken into or out of IC chip 3 through the holes and the conductive layer pattern 6.

According to the arrangement of FIG. 1, the electrode 4 deposited on IC chip 3 and the conductive layer pattern 6 are connected together without the aid of a bonding wire, thereby enabling the IC card to be fabricated with a small thickness. Further, a thermoplastic insulating resin sheet prepared from the same material, for example, as core sheet 1, is interposed between the end portions of the conductive layer pattern 6 and the surface of IC chip 3. Even if, therefore, a passivation layer falls off part of the surface of IC chip 3, electric short circuiting does not arise between IC chip 3 and conductive layer pattern 6 through the fallen portion of the passivation layer.

Figure 2A:
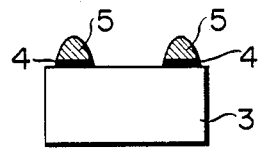
FIGS. 2A to 2E are sectional views indicating the sequential steps of manufacturing the IC card representing the present invention.

Description may now be made with reference to FIGS. 2A to 2E of the steps of manufacturing an IC card according to the method of the present invention. First, a thermoplastic core sheet (not shown) is provided which has at least one penetrating hole 2 and is made thicker than an IC chip. Then, as shown in FIG. 2A, conductive projections 5 are mounted on electrodes 4 of IC chip 3. Conductive projection 5 should be made of such material as has a lesser hardness than silicon constituting IC chip 3 in order to prevent IC chip 3 from being broken when conductive projection 5 undergoes pressure.

It is preferred that conductive projection 5 be prepared from a transition metal selected from the group consisting of Au, Cu, Ag, Al, Zn, Pd, Sn, Os, Pt and Ir or an low-temperature melting alloy composed of at least two metals selected from the group consisting of Pd, Sn, In, Ag, Ga, Au, Bi, Te, Ge and Sb.

Description may now be made of forming conductive projection 5. When conductive projection 5 is formed of a transition metal, it is preferred to select any of the following processes: ball bonding, electroplating, vacuum deposition, sputtering, ion plating, laser growing and transcripting processes. When a low-temperature melting alloy is chosen, it is preferred to apply ultrasonic waves to the fusion of a low-temperature melting alloy and dip an IC chip in the fusion. Further, conductive projection 5 may also be prepared from a mass composed of metal and resin. In this case, it is advised to mix epoxy resin with silver powder, knead them into a paste and deposit the mass on the electrode of IC chip 3.

The height of conductive projection 5, namely, a height from the surface of IC chip 3 to the surface of conductive projection 5 is preferred to be a measurement arrived at by subtracting the thickness of IC chip 3 (in this example, 0.29 mm) from the thickness of core sheet 1 (in this example, 0.32 mm), namely, larger than 30 microns. In the aforementioned example, ball bonding involving Au was applied to the surface of the electrode of IC chip 3. Later, the bonding wire portion was cut off, thereby retaining Au balls alone on the electrode as conductive projections. In this case the height of the Au ball, namely, conductive projection 5, measured 50 microns.

Figure 2B:
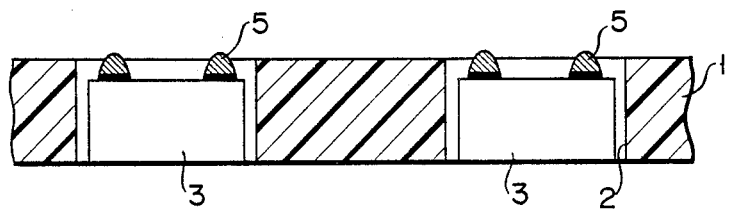

Then, as shown in FIG. 2B, IC chip 3 provided with conductive projections 5 is inserted into penetrating hole 2 having a larger opening than the outer measurement of IC chip 3. In this case, care is taken to insert IC chip 3 in such a manner that conductive projections 5 are set on the main surface of core sheet 1. Core sheet 1 may be prepared not only from the aforementioned polycarbonate resin, but also from any of the following resins: polyvinyl chloride, polyvinyl chloride-acetate copolymer, polysulfone, polyethylene terephthalate, polyetherketone, polymethyl-pentene, polyallylate, polyether-sulfone, polyether-imide, polyphenylen-sulfide and ABS. When IC chip 3 is inserted into penetrating hole 2, the rear surface of IC chip 3 is made flush with the rear surface of core sheet 1. At this time the top of conductive projection 5 projects 0.02 mm from the front surface (main surface) of core sheet 1.

Figure 2C:
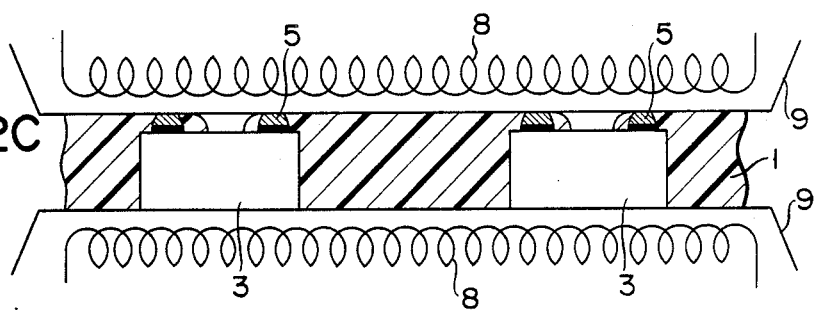

In the next step, as shown in FIG. 2C, core sheet 1 is sandwiched between two heating and pressurizing members each containing heating coil 8 to be heated and pressurized. Now let it be supposed that polycarbonate core sheet 1 is heated to 200° C., and a pressure of 20 kgf/cm² is applied between the top and bottom surfaces of core sheet 1. Then core sheet 1 undergoes plastic deformation, and a space between the side surfaces of IC chip 3 and the inner surfaces of penetrating hole 2 is filled with polycarbonate resin. As a result, the top surface of conductive projection 5 is made flush with the main surface of core sheet 1. At this time, the side surface of conductive projection 5 is covered with the material of core sheet 1, and the top surface of conductive projection 5 is exposed. The foregoing step may be replaced by the process of pressurizing conductive projections 5 in advance to reduce its height to a level reached by subtracting the thickness of semiconductor chip 3 from that of core sheet and thereafter pressurizing core sheet 1.

Figure 2D:
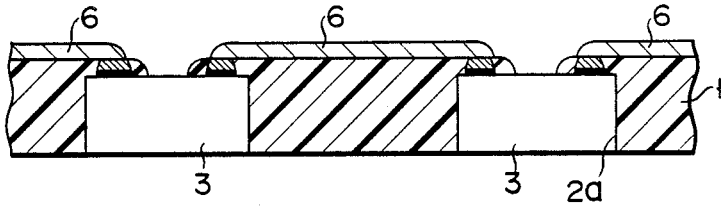

Later, as shown in FIG. 2D, a conductive layer pattern 6 is formed on the main surface of core sheet 1 in such a manner that an end portion of the conductive layer pattern contacts the exposed top surface of conductive projection 5. Conductive layer pattern 6 can be prepared by the process of mixing resin with powder of a single metal selected from the group consisting of Au, Ag, Cu, Pt, Ni, Sn, W, Mo Pd, SiC, C and $RuO_2$, or powder of an alloy composed of at least two metals selected from the group, or powder of metal oxide to provide a conductive paste, and printing the paste.

The content of the metal powder mixed with the resin varies with the kind of the metal. In the case of the powder of Ag, at least 70% by weight will provide paste of high conductivity. In the example of the present invention, conductive layer pattern 6 is formed by mixing 90% by weight of Ag powder with polycarbonate resin and screen printing the resultant Ag paste. When powder of any other metal is applied, it will serve the purpose if the resin is mixed with a sufficient amount of metal powder to render the resultant paste effectively conductive.

A conductive layer pattern 6 can also be prepared by the process of depositing a layer of any metal selected from the group consisting of Au, Ag, Cu, Pt, Ni, Sn, W, Mo, and Pd on the surface of core sheet 1 by the process of vacuum deposition, sputtering or electroless plating and fabricating a prescribed pattern of conductive layer by photolithography.

Figure 2E:
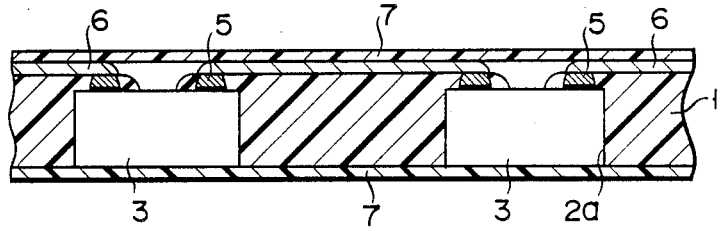

Later, as indicated in FIG. 2E, cover sheet 7, prepared from the same material as that of core sheet 1, is deposited on both top and bottom surfaces of core sheet 1. Cover sheet 7 is fused with the core sheet 1 and conductive layer pattern 6 by applying heat and pressure. Later, the fused mass is punched in the prescribed pattern to provide a required IC card.

The above-mentioned IC card manufacturing method embodying the present invention offers the advantages that the IC card can be fabricated with a sufficiently small thickness; electrodes on the IC chip can obviously be connected with the conductive layer pattern without the occurrence of electric short circuiting between the surface of IC chip and the conductive layer pattern; and the IC card embodying the present invention has been experimentally proved to ensure satisfactory operating properties and high reliability.

What is claimed is:

1. An IC card, comprising an insulating core sheet formed of an insulating material and having a main surface, a bottom surface, and at least one through-hole, at least one semiconductor IC chip received within said hole, and having a main surface and a bottom surface, and at least one electrode, and at least one conductive layer pattern deposited on said core sheet, said conductive layer being connected to said electrode; and said semiconductor IC chip being thinner than said core sheet and including at least one conductive projection which is formed on said electrode and has top and side surfaces, said semiconductor IC chip being embedded in said core sheet by the insulating material so that the top surface of said conductive projection and the bottom surface of said IC chip are flush with the main surface and bottom surface of the core sheet, respectively; said conductive layer pattern being deposited on the main surface of said core sheet; and the side surface of said conductive projection and only the peripheral portion of the main surface of said IC chip being covered with the material of said core sheet and said conductive layer pattern being connected with said conductive projection at said top surface.

2. The IC card according to claim 1, wherein said conductive projection is prepared from a softer material than said semiconductor IC chip.

3. The IC card according to claim 2, wherein said conductive projection is prepared from at least one metal selected from the group consisting of Au, Cu, Ag, Al, Zn, Pd, Sn, Os, Pt and Ir.

4. The IC card according to claim 2, wherein said conductive projection is made of an alloy prepared from at least two metals selected from the group consisting of Pd, Sn, In, Ag, Ga, Au, Bi, Te, Ge and Sb.

5. The IC card according to claim 2, wherein said conductive projection is prepared from a mass composed of a metal and a resin.

6. The IC card according to claim 1, wherein said core sheet comprises a thermoplastic core sheet, and said conductive projection is formed in such a manner that a distance from the top surface of said conductive projection to that of said semiconductor IC chip is defined to be equal to or longer than a measurement arrived at by subtracting the thickness of said semiconductor IC chip from that of said thermoplastic core sheet.

7. The IC card according to claim 1, wherein said thermoplastic core sheet is prepared from at least one resin selected from the group consisting of polycarbonate, polyvinyl chloride, polyvinyl chloride-acetate copolymer, polysulfone, polyethylene terephthalate, polyetherketone, polymethylpenten, polyallylate, polyether-sulfone, polyether-imide, polyphenylene-sulfide and ABS.

8. The IC card according to claim 1, wherein said core sheet comprises a thermoplastic core sheet, and said conductive layer pattern is printed on the surface of the thermoplastic resin core sheet by means of conductive paste formed by kneading at least one of the groups consisting of metal powder, metal alloy powder and metal oxide powder with a resin, said metal powder being prepared from at least one metal selected from the group consisting of Au, Ag, Cu, Pt, Ni, Sn, W, Mo, Pd, SiC, C and $RuO_2$ and said metal alloy powder being formed of a metal alloy composed of at least two of metal group.

9. The IC card according to claim 1, wherein said conductive layer pattern is prepared by depositing at least one metal selected from the group consisting of Au, Ag, Cu, Pt, Ni, Sn, W and Mo on the main surface of said core sheet by one of the following processes: vacuum depositing, sputtering, and electroless plating, and then patterning said deposited metal layer by means of photolithography.

* * * * *